United States Patent [19]

Kotaka et al.

[11] Patent Number: 4,933,479

[45] Date of Patent: Jun. 12, 1990

[54] CROSSLINKED POLYPHOSPHAZENES AS PIEZOELECTRIC MATERIALS

[75] Inventors: Tadao Kotaka, Ikeda; Keiichiro Adachi, Toyonaka, both of Japan

[73] Assignee: Idemitsu Petrochemical Co., Ltd., Tokyo, Japan

[21] Appl. No.: 430,095

[22] Filed: Oct. 26, 1989

Related U.S. Application Data

[63] Continuation of Ser. No. 186,623, Apr. 27, 1988, abandoned.

[30] Foreign Application Priority Data

Jul. 27, 1987 [JP] Japan .................................. 62-187334

[51] Int. Cl.$^5$ .............................................. C07C 9/24
[52] U.S. Cl. .................................. 558/199; 528/399; 310/800
[58] Field of Search ......................... 558/199; 528/399; 204/59 R, 155

[56] References Cited

U.S. PATENT DOCUMENTS 4,303,733 12/1981 Bulle et al. ........................ 428/395

*Primary Examiner*—Anton H. Sutto
*Attorney, Agent, or Firm*—Frishauf, Holtz, Goodman & Woodward

[57] ABSTRACT

Piezoelectric materials characterized by consisting essentially of crosslinked polyphosphazenes obtained by bringing polyphosphazenes which have repeating structural units represented by the general formula [I]

$$\text{\textendash}[NP(X)_a(Y)_b]\text{\textendash} \qquad [I]$$

(all the symbols are as defined in the appended claims) into oriented state in an electric field provided by applying high voltage on them and then crosslinking them under such conditions.

Piezoelectric materials thus obtained display an excellent piezoelectric effect and, in addition, rubber elasticity.

18 Claims, 1 Drawing Sheet

CROSSLINKED POLYPHOSPHAZENES AS PIEZOELECTRIC MATERIALS

This application is a continuation of application Ser. No. 07/186,623, filed Apr. 27, 1988, abandoned.

BACKGROUND OF THE INVENTION

The present invention relates to piezoelectric materials, characterized by comprising certain specific crosslinked polymer compounds having rubber elasticity.

In general, a material generates voltage when imposed on with force or distortion, and vice versa: the phenomenon is called piezoelectric phenomenon or piezoelectric effect.

The materials that show piezoelectric effect (piezoelectric phenomenon) are called piezoelectric materials, and were mainly such inorganic materials as rock crystal and lead titanate zirconate [PZT: $Pb(Zr,Ti)O_3$]. Recently, however, polyvinylidenefluoride (PVDF) was found to show remarkable piezoelectric effect and pyroelectric effect, and since then various other polymer compounds also have actively been studied in their piezoelectric effect, including vinylidenefluoride (VDF)-trifluoroethylene (TrFE) copolymers, polyvinylidenecyanide, vinylidenecyanide (VDCN)-vinylacetate (VAc) copolymers, PVDF based blends with polyurethane, and resin blends based on polyester or polycarbonate which have aromatic hydroxycarboxylic acid residues in their molecular structure. As a result, a number of piezoelectric polymer compounds have been proposed (Japanese Patent Kokai Sho 59-98576, 51-70245, 62-224090 and 48-6297).

The piezoelectric materials hitherto developed, however, are all hard and stiff materials, i.e. inorganic materials such as ceramics and crystalline polymer compounds as mentioned above. Furthermore, these polymer compounds do not show sufficient piezoelectric effect for practical use.

SUMMARY OF THE INVENTION

The object of the present invention is to provide the materials having rubber elasticity and, at the same time, capable to display piezoelectric effect sufficient enough for practical use.

The present inventors made their efforts to develop such materials as to meet the object as mentioned above. As a result, it was found that the object could be fully satisfied by use of crosslinked polymer compounds specifically obtained by crosslinking of such polymer compounds that have dipoles in their molecular structure in a same direction parallel to principal chains under the conditions of oriented state caused by applying high voltage on them. The present invention came out from such a finding.

As can be seen from the above description, the present invention is to provide piezoelectric materials characterized by consisting essentially of crosslinked polymer compounds specifically obtained by bringing such polymer compounds that have dipoles in their molecular structure in a same direction parallel to principal chains into oriented state in an electric field formed by application of high voltage on them and then crosslinking them under such conditions.

DESCRIPTION OF PREFERRED EMBODIMENTS

Figure 1:
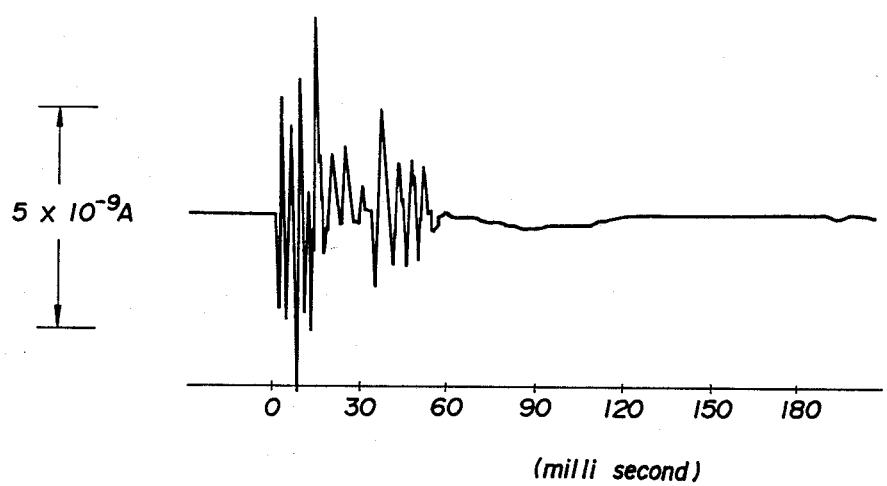
FIG. 1 shows a graph of piezoelectric signals measured by the transient distortion method (pulse excitation method) with use of the product obtained in Example 3.

According to the present invention, the polymer compounds that have dipoles in their molecular structure in a same direction parallel to principal chains are those that their dielectric relaxation modes shown in their diluted solutions in terms of distribution and orientation of dipole moment belong to Type-A according to the Stockmayer's classification, e.g. polymer compounds of which principal chains are composed of polyphenylene oxides, polyethers, polyesters, polydienes, polyamides, polyurethanes, polysulfones and polyphosphazenes. As embodiments, those principal chains are:

Polyphenylene oxides which have repeating structural units represented by the general formula

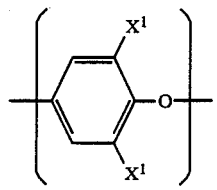

wherein $X^1$ is an alkyl group or a halogen atom,

Polyethers which have repeating structural units represented by the general formula

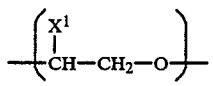

wherein $X^1$ is the same as defined above,

Polyesters which have repeating structural units represented by the general formula

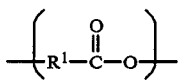

wherein $R^1$ is an alkylene group,

Polydienes which have repeating structural units represented by the general formula

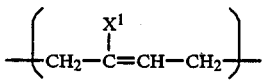

wherein $X^1$ is the same as defined above,

Polyamides which have repeating structural units represented by the general formula

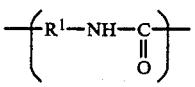

wherein $R^1$ is the same as defined above,

Polyurethanes which have repeating structural units represented by the general formula

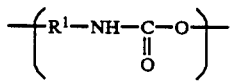

wherein R¹ is the same as defined above,

Polysulfones which have repeating structural units represented by the general formula

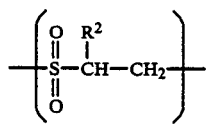

wherein R² is an alkyl group, and

Polyphosphazenes which have repeating structural units represented by the general formula

wherein a and b are real numbers satisfying $0 < a \leq 2$, $0 \leq b < 2$ and $a+b=2$ at the same time, and X and Y are each aryloxy, alkyl, halogenoalkoxy or amino groups, preferably phenoxy group for X and halogenoalkoxy groups having carbon numbers of 1 to 20 or amino groups for Y.

Among those mentioned above, the polyphosphazenes have repeating structural units represented by the general formula [I] as mentioned above and of which polymerization degree is not less than 3 are preferable.

The piezoelectric materials according to the present invention start from such raw materials as polymer compounds that have dipoles in their molecular structure in a same direction parallel to principal chains (polymers belonging to Type-A), preferably polyphosphazenes which have repeating structural units represented by the general formula [I] and of which polymerization degree is not less than 3, and are obtained by crosslinking of these raw materials under certain specified conditions. The polyphosphazenes preferably used in the present invention are composed of repeating structural units having the general formula [I] described above.

In the general formula [I], X and Y are each aryloxy, alkyl, halogenoalkoxy or amino groups, preferably X is a phenoxy group and Y is a halogenoalkoxy group having carbon numbers of 1 to 20 or an amino group. In the general formula [I], the halogenoalkoxy groups includes fluoroethoxy, fluoropropoxy and fluoropentoxy groups, and a and b are real numbers which satisfy $0 < a \leq 2$, $0 \leq b < 2$ and $a+b=2$ at the same time, preferably $1 \leq a \leq 2$ and $0 \leq b \leq 1$. It is noted that the general formula [I] does not mean a single polymer compound, but the average composition for a mixture consisting of several kinds of polymers or copolymers. Therefore, a and b which show the number of existing groups are not necessarily integers and include decimal real numbers.

In the polyphosphazenes according to the present invention, the polymerization degree is not less than 3, preferably greater than 15 and most preferably in a range of 50 to 10,000.

The polyphosphazenes such as mentioned above can be prepared in various manners: for example, oligomers of dichlorophosphazene (cyclic compounds having a general formula $(NPCl_2)_n$ or straight chain compounds having a general formula $Cl_4P.(NPCl_2)_{n-1}.NPCl_3$, wherein n is not less than 3, preferably in a range of 3 to 18) are subjected to bulk polymerization or solution polymerization with use of a suitable initiator to form polydichlorophosphazene chain polymer, which is then brought in a reaction with phenolate or combination of phenolate and halogenoalcoholate (e.g. trifluoroethylate) to produce the polyphosphazenes having repeating structural units represented by the general formula [I]. In the preparation method mentioned above as an example, nearly all of the chlorine atoms bonding to polydichlorophosphazene can be substituted by phenoxy or halogenoalkoxy groups, but some remain unreacted in the resulting polyphosphazenes: such chlorine containing polyphosphazenes can also be used in the present invention without any problem.

The crosslinked polymer compounds according to the present invention can be obtained by bringing the polymer compounds which belong to Type-A as mentioned above into an oriented state in an electric field by applying high voltage on them and then crosslinking them under such conditions. For example, crosslinked polyphosphazenes according to the present invention are prepared as follows: Polyphosphazenes which are prepared as mentioned above and have repeating structural units represented by the general formula [I] are brought into oriented state in an electric field by applying high voltage on them and then crosslinked under such conditions. The treatment mentioned here to bring materials into an oriented state in an electric field by applying high voltage on them means a process to be done necessarily to orient dipoles of the Type-A polymer compounds.

The level of high voltage applied on these materials can be chosen rather arbitrarily, provided that the level does not exceed the dielectric breakdown voltage for the materials, and usually is chosen to form an electric field in a range of 0.1 to 20 kV/mm, preferably in a range of 0.5 to 10 kV/mm. In addition, the temperature used in this treatment can be chosen arbitrarily, depending on the decomposition temperature of crosslinking agents to be used, and preferably is chosen in a range of room temperature to 150° C. or most preferably in a range of 60° to 120° C.

To obtain the crosslinked polymer compounds according to the present invention, for example to obtain crosslinked polyphosphazenes according to the present invention, the raw material polyphosphazenes having repeating structural units of the general formula [I] should be crosslinked in an electric field by applying high voltage on them. In such crosslinking treatment, benzoyl peroxide and other crosslinking agents can be used at a temperature range of 60° to 120° C. When the crosslinking treatment is carried out without imposing high voltage, i.e. without orientation of dipoles, the resulting crosslinked polyphosphazenes do not display piezoelectric effect sufficient for practical use.

The crosslinked polymer compounds thus obtained according to the present invention display excellent piezoelectric effect as well as rubber elasticity.

The piezoelectric materials according to the present invention are characterized by comprising polymer compounds capable of displaying an excellent piezoelectric effect compared with those according to traditional arts and, in addition, rubber elasticity, and, for this reason, they can display unique piezoelectric effect. As can be seen from the measurements by the transient distortion method, this unique piezoelectric effect is especially in the fact that it varies with variation of elastic modulus and shape of stressing materials as well as with the variation of stressing velocity (impact velocity).

The piezoelectric materials according to the present invention are therefore expected to be applied in such fields as tactile sensors capable to recognize mechanical properties of objects and builtin sensors of robot hands capable to hold fragile objects. Of course, they can also be widely applied in various fields where traditional piezoelectric materials are used as, for example, transformation devices between electric and mechanical energies including ultrasonic transducers, audiotransducers and instrumental transducers in medical, instrumentation and information industries.

The present invention will be explained further in detail by examples below:

SYNTHESIS EXAMPLE 1

(1) Synthesis of Polydichlorophosphazene

In a glass ampule were placed 40 g of hexachlorocyclotriphosphazene and 1 g of boron trichloride ($BCl_3$), and, after sealing of the ampule, subjected to polymerization at 170° C. for 70 hrs.

The resulting polydichlorophosphazene was placed in an amount of 10 g in a 2000 ml round flask provided with a stirrer, a cooler, a thermometer and a dropping funnel, and then dissolved in 500 ml of tetrahydrofuran (THF).

(2) Synthesis of Polyphosphazene (polyphenoxyfluoroethoxyphosphazene)

In a 2000 ml round flask provided with a stirrer, a cooler, a thermometer and a dropping funnel were placed 500 ml of THF, 90 g of phenol, 4 g of 2,2,2-trifluoroethanol and 100 g of metallic sodium, and subjected to reaction under reflux to prepare a THF solution containing phenolate and ethylate.

The solution was dropped slowly through the dropping funnel onto the THF solution of polydichlorophosphazene previously prepared in (1), and then subjected to reaction to under reflux for 70 hrs.

After the reaction completed, the resulting solution was poured in a large amount of water to precipitate polymer product. The polymer product was purified by repeating the procedure of dissolution in THF and precipitation in water five times. The purified polymer was identified to be polyphosphazene (polyphenoxyfluoroethoxy phosphazene) of molecular weight ca. 200,000 consisting of repeating structural units of the general formula [I], wherein X was phenoxy group, Y was 2,2,2-trifluoroethoxy group, a=1.8 and b=0.2 (hereinafter briefly called PPPN-1).

SYNTHESIS EXAMPLE 2

The same method as in (2) of Synthesis Example 1 was carried out for preparation of polymer except that the THF solution containing phenolate and ethylate was prepared with use of 2000 ml of THF, 70 g of phenol, 20 g of 2,2,2-trifluoroethanol and 100 g of metallic sodium. The resulting polymer purified was identified to be polyphosphazene (polyphenoxyfluoroethoxyphosphazene) of molecular weight ca. 200,000 consisting of repeating structural units of the general formula [I], wherein X was phenoxy group, Y was 2,2,2-trifluoroethoxy group, a=1 and b=1 (hereinafter briefly called PPPN-2).

SYNTHESIS EXAMPLE 3

The same method as in (2) of Synthesis Example 1 was carried out for preparation of polymer except that 500 ml of dioxane, 90 g of phenol and 100 g of metallic sodium were used to prepare a solution of phenolate. The resulting polymer purified was identified to be polyphosphazene (polydiphenoxyphosphazene) of molecular weight ca. 200,000 consisting of repeating structural units of the general formula [I], wherein X was phenoxy group, a=2, and b=0 (hereinafter briefly called PPPN-3).

EXAMPLE 1

(1) Preparation of Crosslinked PPPN-1

PPPN-1 obtained in (2) of Synthesis Example 1 (phenoxy side chain: 90 mol %, 2,2,2-trifluoroethoxy side chain: 10 mol %) was formed into a shape of film, then put between electrodes and crosslinked with use of 2% of benzoyl peroxide as a crosslinking agent at 90° C. under an applied voltage to provide an electric field at a level of 10 kV/mm to give orientation of the dipoles. Crosslinked PPPN-1 was thus obtained.

(2) Measurement of Piezoelectric Effect (Vibrational Distortion Method (Oscillatory Distortion Method))

The film of crosslinked PPPN-1 obtained in (1) was placed on a dynamic Young's modulus tester (Rheovibron) and subjected to vibrational distortion (110 Hz), and in addition, the short-circuit current appearing between electrodes which were placed ca. 0.5 mm apart from the surfaces of the film was measured. The values of piezoelectric modulus ($d_{31}$) thus measured were found to disperse considerably, and their mean value was $5.0 \times 10^{-12}$ Coulomb/Newton. The Young's modulus was found $5.2 \times 10^9$ dyne/cm$^2$.

EXAMPLE 2

(1) Preparation of Crosslinked PPPN-2

PPPN-2 obtained in Synthesis Example 2 (phenoxy side chain: 50 mol %, 2,2,2-trifluoroethoxy side chain: 50 mol %) was formed into a shape of film, and then crosslinked while applying high voltage according to (1) of Example 1. Crosslinked PPPN-2 was thus obtained.

(2) Measurement of Piezoelectric Effect (Vibrational Distortion Method)

For crosslinked PPPN-2, the same measuring method as in (2) of Example 1 was carried out.

The values of piezoelectric modulus ($d_{31}$) were found to disperse considerably, and their mean value was $2.0 \times 10^{-12}$ Coulomb/Newton. For Young's modulus, the value was found to be $4.0 \times 10^9$ dyne/cm$^2$.

EXAMPLE 3

(1) Preparation of Crosslinked PPPN-3

To PPPN-3 obtained in Synthesis Example 3 was added 26 wt % of dibutylphthalate (DBP) as a plasticizer and then formed into a shape of film. After that, the film was crosslinked according to the same method as described in (1) of Example 1 except that the applied voltage provided an electric field of 800 V/mm. Crosslinked PPPN-3 was thus obtained.

(2) Measurement of Piezoelectric Effect (Transient Distortion Method)

The film (diameter: 2 cm, thickness: 2 mm) of crosslinked PPPN-3 prepared in (1) was sandwitched between electrodes, onto which a weight of 200 g was dropped from a height of ca. 2 cm to measure piezoelectric signals caused by such an impact.

As a result, a complicated damping oscillation curve of electric current was observed with maximum current of 5 nA, which is shown in FIG. 1.

What is claimed is:

1. A piezoelectric element comprising polyphosphazenes crosslinked in the oriented state in an electric field and having piezoelectric characteristics; said polyphosphazenes having repeating structural units represented by the following formula (I)

wherein a and b are real numbers and $1 \leq a \leq 2$, $0 \leq b \leq 1$ and $a+b=2$, X is a phenoxy group and Y is a halogenoalkoxy group having carbon numbers of 1 to 20 or an amino group, and a polymerization degree of at least 3; and said oriented state having been obtained by an applied high voltage to provide an electric field of from 0.1 to 20 kV/mm.

2. The piezoelectric element of claim 1 wherein the polymerization degree of said polyphosphazenes is greater than 15.

3. The piezoelectric element as claimed in claim 1 wherein X is phenoxy group, Y is 2,2,2-trifluoroethoxy group, a is 1.8 and b is 0.2.

4. The piezoelectric element as claimed in claim 1 wherein X is phenoxy group, Y is 2,2,2-trifluoroethoxy group, a is 1 and b is 1.

5. The piezoelectric element as claimed in claim 1 wherein X is phenoxy, a is 2 and b is 0.

6. The piezoelectric element of claim 1 wherein the polymerization degree of said polyphosphazenes is from 50 to 10,000.

7. The piezoelectric element of claim 3 wherein the polymerization degree of said polyphosphazenes is from 50 to 10,000.

8. The piezoelectric element of claim 4 wherein the polymerization degree of said polyphosphazenes is from 50 to 10,000.

9. The piezoelectric element of claim 5 wherein the polymerization degree of said polyphosphazenes is from 50 to 10,000.

10. A process for producing a piezoelectric element consisting essentially of crosslinking polyphosphazenes having repeating structural units represented by the following formula (I)

wherein
a and b are real numbers satisfying $1 \leq a \leq 2$, $0 \leq b \leq 1$ and $a+b=2$, X is phenoxy group and Y is a halogenoalkoxy group having carbon numbers of 1 to 20 or an amino group, and a polymerization degree of at least 3;
comprising positioning said polyphosphazenes having repeated structural units represented by said formula (I) in an electric field of from 0.1 to 20 kV/mm provided by an applied high voltage to orient said polyphosphazenes and then crosslinking said polyphosphazenes at a temperature of 60° to 120° C. by use of a crosslinking agent while in said electric field.

11. The process as claimed in claim 10 wherein the polymerization degree of said polyphosphazenes is greater than 15.

12. The process as claimed in claim 10 wherein the polymerization degree of said polyphosphazenes is from 50 to 10,000.

13. The process as claimed in claim 10 wherein said electric field is from 0.5 to 10 kV/mm.

14. The process as claimed in claim 10 wherein benzoyl peroxide is used as the crosslinking agent.

15. The process as claimed in claim 13 wherein benzoyl peroxide is used as the crosslinking agent.

16. The process as claimed in claim 13 wherein the polymerization degree of said polyphosphazenes is from 50 to 10,000.

17. The process as claimed in claim 14 wherein the polymerization degree of said polyphosphazenes is from 50 to 10,000.

18. The process as claimed in claim 15 wherein the polymerization degree of said polyphosphazenes is from 50 to 10,000.

* * * * *